United States Patent
Khan et al.

(10) Patent No.: US 7,432,748 B2
(45) Date of Patent: Oct. 7, 2008

(54) SEQUENCE-INDEPENDENT POWER-ON RESET FOR MULTI-VOLTAGE CIRCUITS

(75) Inventors: Qadeer A. Khan, New Delhi (IN); Siddhartha Gk, New Delhi (IN)

(73) Assignee: Freescale Semiconductor, Inc, Austin, TX (US)

( * ) Notice: Subject to any disclaimer, the term of this patent is extended or adjusted under 35 U.S.C. 154(b) by 32 days.

(21) Appl. No.: 11/538,295

(22) Filed: Oct. 3, 2006

(65) Prior Publication Data
US 2007/0080726 A1 Apr. 12, 2007

(30) Foreign Application Priority Data
Oct. 3, 2005 (IN) .......................... 2636/DEL/2005

(51) Int. Cl.
*H03L 7/00* (2006.01)
(52) U.S. Cl. .................... 327/143; 327/142; 327/198
(58) Field of Classification Search ................ 327/142, 327/143, 198
See application file for complete search history.

(56) References Cited

U.S. PATENT DOCUMENTS

| | | | |
|---|---|---|---|
| 5,786,719 A * | 7/1998 | Furutani | ............ 327/202 |
| 6,160,430 A | 12/2000 | Drapkin et al. | |
| 6,236,250 B1 | 5/2001 | Salmon et al. | |
| 6,593,790 B2 | 7/2003 | Kim | |
| 6,853,221 B1 | 2/2005 | Wert | |
| 6,870,400 B1 * | 3/2005 | Chong et al. | ............ 326/82 |
| 6,967,522 B2 * | 11/2005 | Chandrakasan et al. | ..... 327/534 |
| 2004/0012419 A1 * | 1/2004 | Kim et al. | ............ 327/143 |
| 2004/0036514 A1 * | 2/2004 | Kwon | ............ 327/143 |

* cited by examiner

*Primary Examiner*—Kenneth B. Wells
*Assistant Examiner*—John W Poos
(74) *Attorney, Agent, or Firm*—Charles Bergere (57) ABSTRACT

A power-on reset ("POR") methodology and circuit for an electronic circuit using multiple supply voltage domains asserts a reset signal upon ramp up of the first supply voltage signal, maintains the reset signal until all of the supply voltage signals have ramped up, and de-asserts the reset signal after all of the supply voltage signals have ramped up. Practical embodiments of the POR circuit include a control circuit that reduces static and/or dynamic current leakage associated with the operation of the POR circuit.

9 Claims, 5 Drawing Sheets

FIG. 1

—PRIOR ART—

FIG. 2

—PRIOR ART—

SEQUENCE-INDEPENDENT POWER-ON RESET FOR MULTI-VOLTAGE CIRCUITS

TECHNICAL FIELD

The present invention relates generally to electronic circuits. More particularly, the present invention relates to power-on reset ("POR") techniques and circuits for use with an electronic circuit having multiple power supply voltages.

BACKGROUND OF THE INVENTION

Many integrated circuit chips have multiple voltage domains, i.e., the circuit operates with different power supply voltages. When a digital circuit is powered up, it is usually reset to establish a predetermined state (i.e., initial digital values are populated in registers, memory, etc.). For chips containing multiple voltage domains, some existing POR techniques only detect the ramp-up of the power supply that occurs last in time. Until this time, however, the state of the POR signal or signals is undetermined, which may lead to malfunctioning of the chip, such as contention in tri-state logic circuits and/or malfunctioning of memory circuits. Both of these conditions can lead to excessive and undesirable current consumption. Moreover, conventional POR techniques for multi-voltage circuits are sequence-dependent because they only monitor for ramp-up of the last power supply voltage signal. Since the ramp-up sequences of such circuits are predefined, a random power-up sequence may lead to system failure.

Accordingly, it is desirable to have a sequence-independent POR methodology and related circuit for use in a multi-voltage architecture. In addition, it is desirable to have a POR methodology and related circuit that minimizes steady state and dynamic current consumption associated with the generation of POR signals. Furthermore, other desirable features and characteristics of the present invention will become apparent from the subsequent detailed description and the appended claims, taken in conjunction with the accompanying drawings and the foregoing technical field and background.

BRIEF DESCRIPTION OF THE DRAWINGS

A more complete understanding of the present invention may be derived by referring to the detailed description and claims when considered in conjunction with the following figures, wherein like reference numbers refer to similar elements throughout the figures.

DETAILED DESCRIPTION OF THE INVENTION

The following detailed description is merely illustrative in nature and is not intended to limit the invention or the application and uses of the invention. Furthermore, there is no intention to be bound by any expressed or implied theory presented in the preceding technical field, background, brief summary or the following detailed description.

For the sake of brevity, conventional techniques related to supply voltage signal generation, transistor operation, circuit reset functions, and other functional aspects of the circuits and the individual operating components of the circuits may not be described in detail herein. Furthermore, the connecting lines shown in the various figures contained herein are intended to represent example functional relationships and/or physical couplings between the various elements. It should be noted that many alternative or additional functional relationships or physical connections may be present in a practical embodiment.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element and two or more signals can be multiplexed, modulated, or otherwise distinguished even though received or output at a common mode.

The following description refers to nodes or features being "connected" or "coupled" together. As used herein, unless expressly stated otherwise, "connected" means that one node/feature is directly connected to or directly communicates with another node/feature, and not necessarily mechanically. Likewise, unless expressly stated otherwise, "coupled" means that one node/feature is directly or indirectly coupled to or directly or indirectly communicates with another node/feature, and not necessarily mechanically. Thus, although the schematics shown in the figures depict example arrangements of elements, additional intervening elements, devices, features, or components may be present in an actual embodiment assuming that the functionality of the circuits are not adversely affected.

Figure 1:
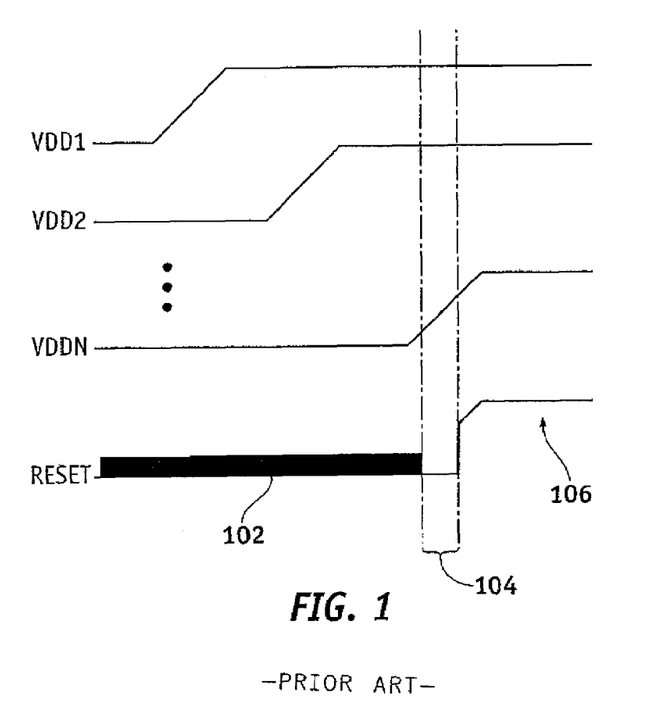
FIG. 1 is a timing diagram of supply voltages and a reset signal corresponding to a conventional power-on reset ("POR") methodology.

FIG. 1 is a timing diagram of supply voltages and a reset signal corresponding to a conventional POR methodology. This diagram generally represents an application that utilizes n different supply voltage domains: VDD1, VDD2, and so on, up to VDDn. FIG. 1 depicts the scenario where VDD1 ramps up first in time, VDD2 ramps up next in time, and VDDn is the last in time to ramp up. In FIG. 1, the reset signal is shaded to indicate a time during which the reset signal is undefined. During this period (identified by reference number 102 in FIG. 1), the reset signal is in an undetermined state, thus making the circuit susceptible to malfunction as stated above. The dashed vertical lines in FIG. 1 represent a brief period (identified by reference number 104 in FIG. 1) during which the VDDn signal is ramping up and during which the reset signal is asserted as logic low. Notably, this assertion only occurs upon ramp-up of the last supply voltage signal, i.e., VDDn. Once all of the supply voltages have ramped up, the reset signal is asserted as logic high. This condition is identified by reference number 106 in FIG. 1.

Figure 2:
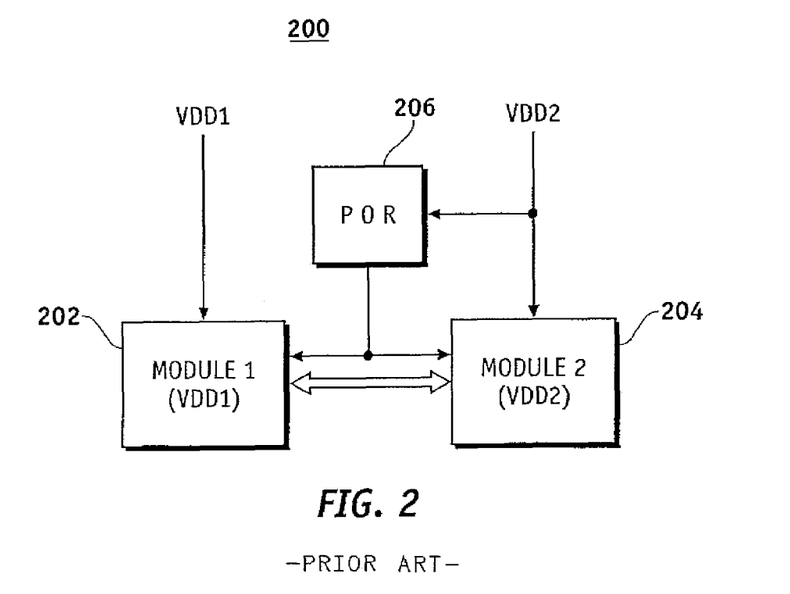
FIG. 2 is a schematic block diagram of a multi-voltage circuit that incorporates a conventional POR technique.

FIG. 2 is a schematic block diagram of a multi-voltage circuit 200 that incorporates a conventional POR technique. The multi-voltage circuit 200 includes a first module 202 that operates at a first supply voltage VDD1, a second module 204 that operates at a second supply voltage VDD2, and a POR circuit 206. The POR circuit 206 is connected to the first module 202 and the second module 204 for purposes of providing the POR signal. As shown in FIG. 2, the POR circuit 206 operates in response to VDD2 and not in response to VDD1; circuit 200 requires a predefined power-up sequence of VDD1 followed by VDD2. Thus, the POR circuit 206 functions to generate the POR signal upon ramp-up of VDD2, which must occur last in time.

In contrast to conventional methodologies, the POR technique described herein asserts the chip reset upon ramp-up of the first power supply signal, and de-asserts the chip reset upon ramp-up of the last power supply signal, regardless of the power supply ramp-up sequence. The chip reset is maintained in its asserted state while at least one, but not all, of the power supply signals has ramped up. This methodology ensures that the chip reset signal remains driven for proper circuit operation. Notably, the ramp-up sequence of the various power supplies need not be predefined, and the particular power supplies that represent the first and last to ramp-up can be random for any given power-up cycle. In practice, the POR technique can be implemented in any integrated circuit chip or architecture that uses more than one voltage supply.

Figure 3:
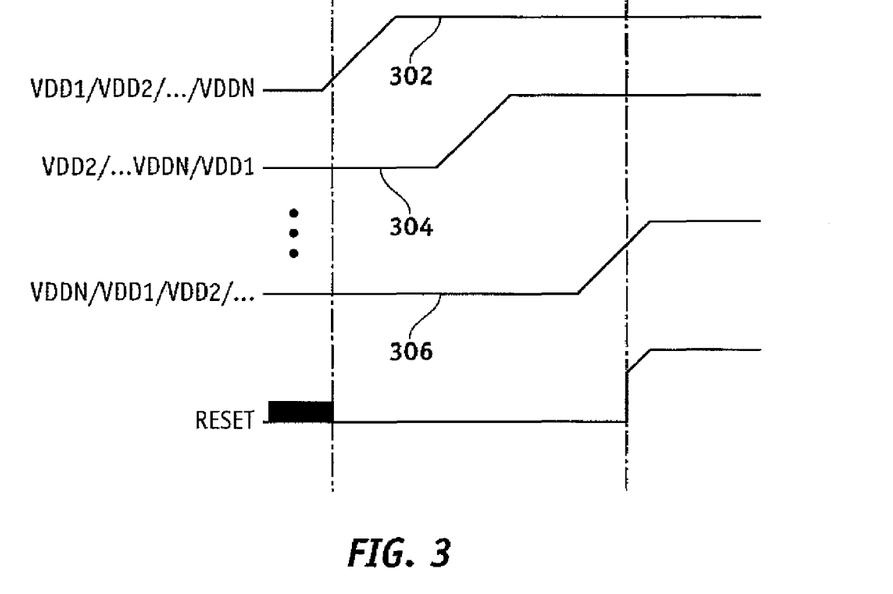
FIG. 3 is a timing diagram of supply voltages and a reset signal corresponding to a POR methodology in accordance with an example embodiment of the present invention.

FIG. 3 is a timing diagram of supply voltages and a reset signal corresponding to a POR methodology according to an example embodiment of the invention. FIG. 3 generally represents an application that uses n different sequence-independent supply voltage domains: VDD1, VDD2, and so on, up to VDDn. As used herein, "sequence-independent" means that the ramp-up (or power-up) order of any of the different supply voltage signals need not be predetermined and that the ramp up order of the different supply voltage signals may be random for any given power-up cycle. Thus, the supply voltage signal 302 in FIG. 3 is arbitrarily labeled VDD1/VDD2/ . . . VDDn to indicate that any one of the multiple supply voltage signals may ramp up first in time. The remaining supply voltage signals in FIG. 3 are similarly labeled, however, the supply voltage signal 304 ramps up next in time and the supply voltage signal 306 ramps up last in time.

In FIG. 3, a portion of the reset signal is shaded to indicate a time during which the reset signal is undefined (i.e., the reset signal is neither asserted high nor asserted low). As depicted in FIG. 3, this period occurs before the supply voltage signal 302 ramps up. In response to the ramping up of the supply voltage signal 302, the reset signal is asserted as logic low. Alternatively, the reset signal can be asserted as logic high if required by the particular application. This state of the reset signal is maintained until the supply voltage signal 306 ramps up. Once all of the supply voltages have ramped up, the reset signal is de-asserted. In other words, the reset signal is asserted as logic high (alternatively, the reset signal can be asserted as logic low if required by the particular application). Thus, the reset signal is maintained while less than all of the sequence-independent supply voltages have ramped up.

Figure 4:
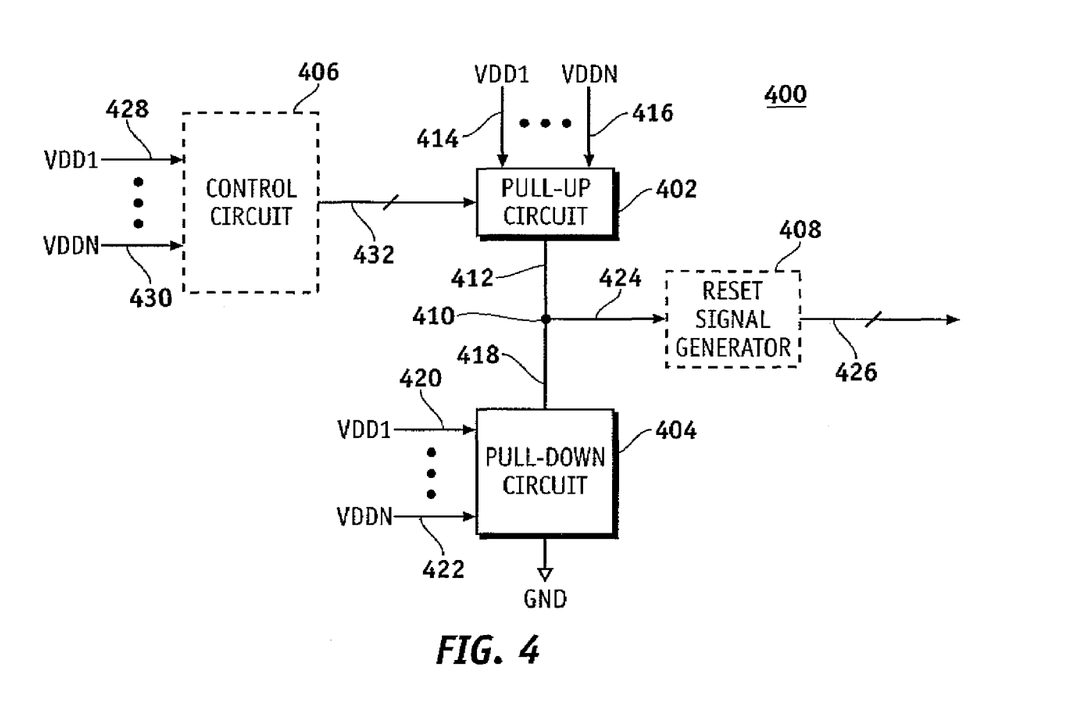
FIG. 4 is a schematic block diagram of a multi-voltage POR circuit in accordance with an example embodiment of the present invention.

FIG. 4 is a schematic block diagram of a multi-voltage POR circuit 400 configured in accordance with an example embodiment of the present invention. In operation, a POR circuit configured in accordance with the invention monitors a plurality of sequence-independent supply voltages, asserts a POR signal (or a plurality of POR signals) when the first supply voltage ramps up, and de-asserts the POR signal (or the plurality of POR signals) when the last supply voltage ramps up. A practical implementation of the POR circuit 400 may be used to achieve the POR methodology depicted in FIG. 3. The POR circuit 400 generally includes a pull-up circuit 402, a pull-down circuit 404, an optional control circuit 406, and an optional POR signal generator 408. The POR circuit 400 also includes a POR node 410 for a POR output signal.

The pull-up circuit 402 includes input nodes for receiving a plurality of supply voltage signals, and an output node 412 coupled to the POR node 410 (in this example, the output node 412 corresponds to the POR node 410). The pull-up circuit 402 is depicted with an input node 414 for a first supply voltage signal VDD1 and an input node 416 for an N-th supply voltage signal VDDn. In practice, the pull-up circuit 402 may include any number of input nodes for any number of supply voltage signals. The pull-down circuit 404 includes input nodes for receiving the supply voltage signals, and an output node 418 coupled to the POR node 410 (in this example, the output node 418 corresponds to the POR node 410). The pull-down circuit 404 is depicted with an input node 420 for the VDD1 signal and an input node 422 for the VDDn signal. In practice, the pull-down circuit 404 may include any number of input nodes for any number of supply voltage signals.

In operation, the pull-up and pull-down circuits 402 and 404 generate a POR output signal 424 at the POR node 410. The POR output signal 424 may represent the actual circuit module reset signal (or signals) or an "intermediate" control signal upon which the module reset signal (or signals) is based. In this example, the pull-up and pull-down circuits 402 and 404 are suitably configured to generate a logic high POR output signal 424 at the POR node 410 in response to ramp up of the first supply voltage signal, where such ramp up occurs first in time compared to the other supply voltage signals in the POR circuit 400. In addition, the pull-up and pull-down circuits 402 and 404 generate a logic low POR output signal 424 at the POR node 410 in response to ramp up of the last supply voltage signal, where such ramp up occurs last in time compared to the other supply voltage signals in the POR circuit 400. Moreover, the pull-up and pull-down circuits 402 and 404 preferably maintain the logic high POR output signal 424 while less than all of the supply voltage signals have ramped up. In other words, in this example embodiment, the POR circuit 400 generates a logic high POR output signal 424 if at least one, but not all, of the supply voltage signals has ramped up, and generates a logic low POR output signal 424 if all of the supply voltage signals have ramped up.

The POR signal generator 408 may be implemented in some practical embodiments of the POR circuit 400 to convert the POR output signal 424 into at least one module reset signal 426 for the multi-voltage circuit to which the POR circuit 400 is coupled. The POR signal generator 408 may be suitably configured to provide an appropriate logic level (low or high) for assertion and de-assertion of the module reset signal 426. In the example embodiments described below, the POR signal generator 408 receives the POR output signal 424 and generates separate module reset signals 426 for each circuit module. In other words, the POR signal generator 408 may have N output nodes for N module reset signals corresponding to N supply voltages. Moreover, in the example embodiments described below, the POR signal generator 408 inverts the POR output signal 424. The POR signal generator 408 is depicted in dashed lines in FIG. 4 because it is an optional element that need not be used in all practical embodiments. Furthermore, a practical embodiment may incorporate the POR signal generator 408 into the circuit modules themselves rather than implementing the POR signal generator 408 as a separate component.

The control circuit 406 may be implemented in some practical embodiments of the POR circuit 400 to influence operation of the pull-up circuit 402. The control circuit 406 is depicted in dashed lines in FIG. 4 because it is an optional component. As described in more detail below, the control circuit 406 may be used to minimize, reduce or prevent steady state current consumption associated with the generation of the POR output signal 424. Alternatively or additionally, the control circuit 406 may be used to minimize, reduce or prevent dynamic current consumption associated with the generation of the POR output signal 424. In this example embodiment, the control circuit 406 is suitably configured to receive the various supply voltages. Thus, the control circuit 406 is depicted with an input node 428 for the VDD1 signal and an input node 430 for the VDDn signal. In practice, the control circuit 406 may include any number of input nodes for any number of supply voltage signals. The control circuit 406 may be coupled to the pull-up circuit 402 via one or more nodes 432 to provide control signals, switching signals, and/or biasing signals to the pull-up circuit 402 as described below.

In operation, the POR circuit 400 is capable of asserting and de-asserting module reset signals in the manner depicted in FIG. 3. The example circuit implementations described herein employ a basic structure that emulates a NAND gate structure. In this regard, if any of the supply voltages is off (i.e., logic low), then the POR output signal 424 is asserted logic high; if all of the supply voltages are on (i.e., logic high), then the POR output signal 424 is asserted logic low. The POR signal generator 408 inverts the POR output signal 424 such that the module reset signal 426 is asserted low if any of the supply voltages is off, and asserted high if all of the supply voltages are on.

Figure 5:
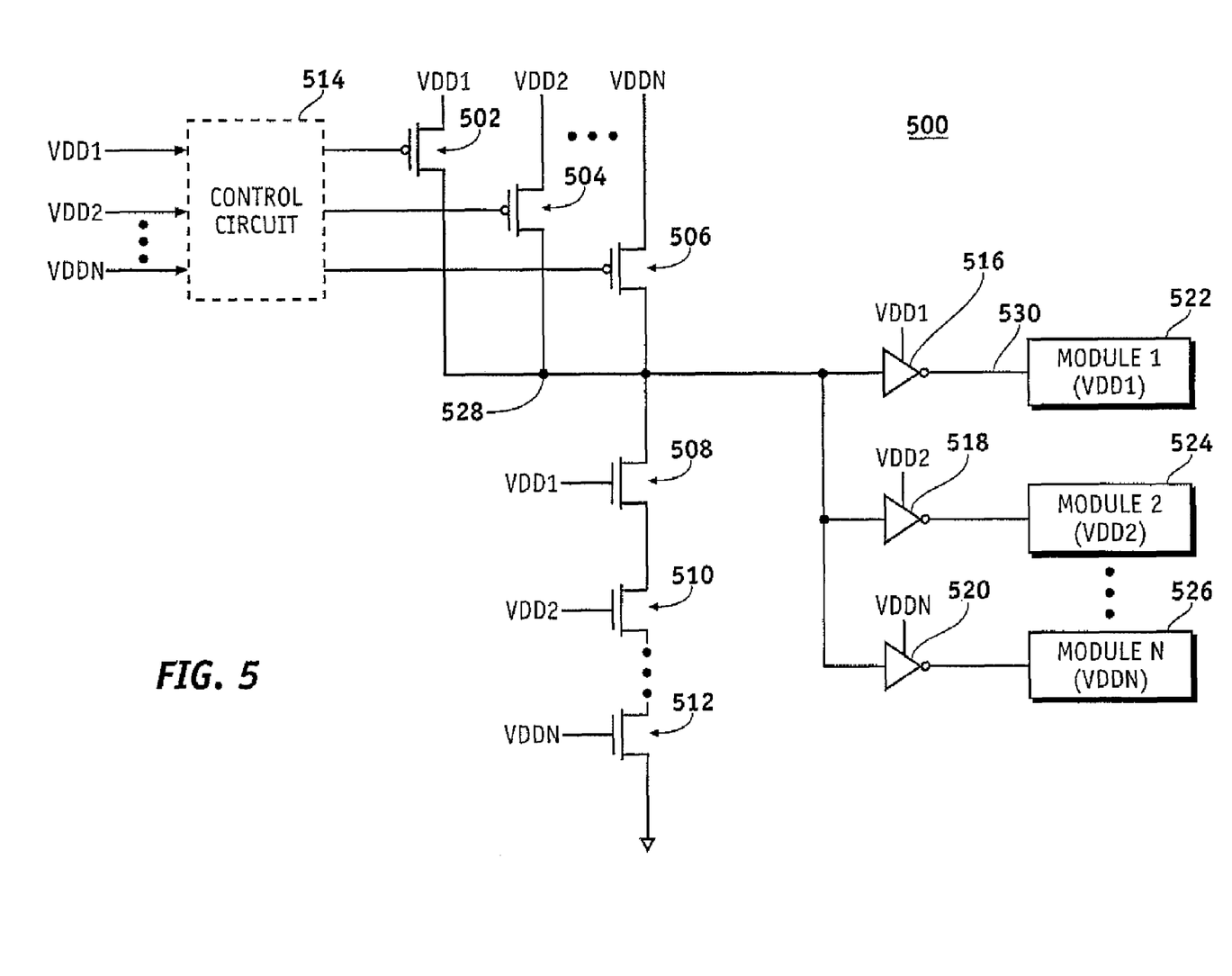
FIG. 5 is a schematic circuit diagram of a multi-voltage POR circuit in accordance with an example embodiment of the invention.

FIG. 5 is a schematic circuit diagram of a multi-voltage POR circuit 500 configured in accordance with an example embodiment of the invention. The POR circuit 500 represents one possible implementation of the POR circuit 400. The POR circuit 500 generally includes a first PMOS transistor 502, a second PMOS transistor 504, an N-th PMOS transistor 506, a first NMOS transistor 508, a second NMOS transistor 510, an N-th NMOS transistor 512, a control circuit 514, a first inverter 516, a second inverter 518, and an N-th inverter 520. Although NMOS and PMOS transistors are described herein, a practical circuit configured in accordance with the invention may employ different transistor types in an equivalent manner. FIG. 5 also shows a first circuit module 522 that operates on a first supply voltage VDD1, a second circuit module 524 that operates on a second supply voltage VDD2, and an N-th circuit module 526 that operates on an N-th supply voltage VDDn. In practice, the supply voltages for the different circuit modules may, but need not, be different voltage levels.

The PMOS transistors represent one practical realization of the pull-up circuit 402, the NMOS transistors represent one practical realization of the pull-down circuit 404, and the inverters represent one practical realization of the POR signal generator 408 (see FIG. 4). The inverters may not be necessary in alternate embodiments where the circuit modules are reset with a logic high signal (rather than a logic low signal as described herein). In addition, the control circuit 514 is similar to the control circuit 406, however, the control circuit 514 is depicted with individual and separate output nodes coupled to a respective PMOS transistor. The above description explains the general operation of these components, and those general aspects will not be redundantly described herein in the context of the POR circuit 500.

Each of the PMOS transistors has a drain coupled to a common POR node 528 and a source for receiving a respective supply voltage signal. In this example, the source of the PMOS transistor 502 receives VDD1, the source of the PMOS transistor 504 receives VDD2, and so on, while the source of the PMOS transistor 506 receives VDDn. As mentioned above in connection with the POR circuit 400, the POR node 528 carries a POR output signal during operation. In addition, the gates of the PMOS transistors are coupled to the control circuit 514. Referring to FIG. 4, the source of each PMOS transistor is coupled to a respective input node of the pull-up circuit 402. In this example, the source of each PMOS transistor corresponds to a respective input node of the pull-up circuit 402.

The NMOS transistors are coupled in series between the POR node 528 and a low reference potential, such as ground in this example. In other words, the drain of NMOS transistor 508 is coupled to the POR node 528, the source of NMOS transistor 508 is coupled to the drain of NMOS transistor 510, and so on, while the source of NMOS transistor 512 is coupled to ground. In this example, each of the NMOS transistors has a gate for receiving a different one of the N supply voltage signals. In particular, the gate of NMOS transistor 508 receives VDD1, the gate of NMOS transistor 510 receives VDD2, and so on, while the gate of NMOS transistor 512 receives VDDn. Referring to FIG. 4, the gate of each NMOS transistor is coupled to a respective input node of the pull-down circuit 404. In this embodiment, the gate of each NMOS transistor corresponds to a respective input node of the pull-down circuit 404.

The PMOS transistors and the NMOS transistors are arranged and configured to generate a high POR signal at the POR node 528 if at least one, but not all, of the supply voltage signals has ramped up, and to generate a low POR signal at the POR node 528 if all of the supply voltage signals have ramped up. Assume, for example, that VDD1 is the first supply voltage to ramp up. The control circuit 514 applies a suitable switching signal to the gate of PMOS transistor 502, thus activating PMOS transistor 502 to pull up the voltage at the POR node 528 to a logic high level. Concurrently, since VDD2 has not yet ramped up, NMOS transistor 510 remains off, creating an open circuit in the series branch of NMOS transistors. Consequently, the logic high level at POR node 528 is seen as an input to each of the inverters. This logic high level is inverted into a logic low level by the inverter 516 to assert a logic low module reset signal 530 for the first circuit module 522. The output states of the other inverters also are asserted low because they also are receiving the logic high level for an input. Thus, the POR circuit 500 is configured to assert a suitable POR signal for the multi-voltage circuit in response to the ramp up of whichever sequence-independent supply voltage occurs first in time. The POR circuit 500 asserts such logic low module reset signals for all of the circuit modules in a similar manner so long as at least one, but not all, of the supply voltage signals has ramped up.

After all of the supply voltage signals have ramped up, all of the NMOS transistors become active, which effectively pulls down the voltage at the POR node 528 to ground. In the example embodiment, the control circuit 514 also operates to switch off the PMOS transistors to prevent steady state and/or dynamic current consumption in this mode. The pulling down of the voltage at the POR node 528 represents a logic low level, which is seen as an input to each of the inverters. This logic low level is inverted into respective logic high levels by the inverters to assert respective logic high module reset signals for the circuit modules. These logic high module reset signals remain asserted as long as all of the supply voltages are on. Thus, the POR circuit 500 de-asserts the POR signals in response to ramp up of the last sequence-independent supply voltage.

Figure 6:
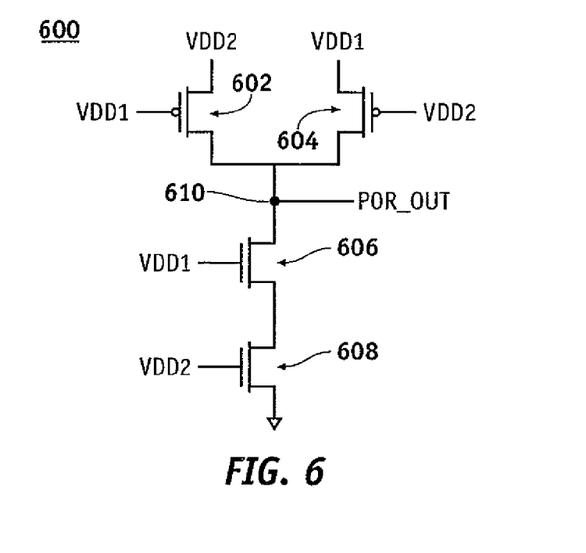
FIG. 6 is a schematic circuit diagram of a dual-voltage POR circuit in accordance with an example embodiment of the invention.

FIG. 6 is a schematic circuit diagram of a dual-voltage POR circuit 600 configured in accordance with an example embodiment of the invention. In practice, the methodology represented by the POR circuit 600 can be extended to contemplate any number of supply voltages. The POR circuit 600 is a simplified implementation that does not include a control circuit as described above. Furthermore, the POR circuit 600 does not include a POR signal generator as described above. Rather, the POR circuit 600 represents a practical embodiment where the number of supply voltages is two (i.e., N=2). The POR circuit 600 generally includes a first PMOS transistor 602, a second PMOS transistor 604, a first NMOS transistor 606, a second NMOS transistor 608, and a POR node 610.

The PMOS transistor 602 has a source coupled to receive a supply voltage VDD2, a gate coupled to receive a supply voltage VDD1, and a drain coupled to POR node 610. In this example, the drain of PMOS transistor 602 corresponds to the POR node 610. The PMOS transistor 604 has a source coupled to receive VDD1, a gate coupled to receive VDD2, and a drain coupled to POR node 610. In this example, the drain of PMOS transistor 604 also corresponds to the POR node 610. The NMOS transistor 606 has a drain coupled to POR node 610, a gate coupled to receive VDD1, and a source coupled to the drain of NMOS transistor 608. The NMOS transistor 608 has a gate coupled to receive VDD2, and a source coupled to ground. As described above in connection with the POR circuit 500, the NMOS transistors are connected in series between the POR node 610 and ground.

The operation of the POR circuit 600 follows the same basic methodology as the POR circuit 500. Namely, the signal at the POR node 610 (labeled POR_OUT) goes high as soon as either supply voltage starts ramping up, and goes low as soon as the other supply voltage starts ramping up. In practice, however, the POR circuit 600 will draw some steady state current if the voltage levels of VDD1 and VDD2 are not equal. Although such steady state current consumption may be tolerable in some applications, it may be undesirable in low power applications.

Figure 7:
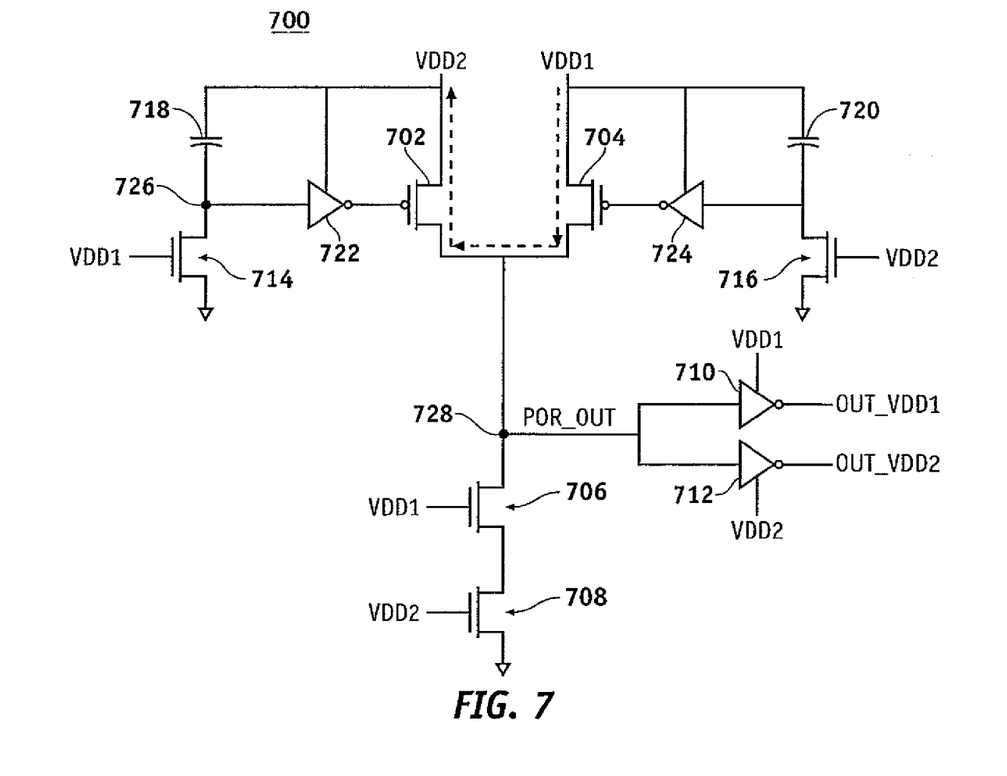
FIG. 7 is a schematic circuit diagram of a dual-voltage POR circuit in accordance with another example embodiment of the invention.

FIG. 7 is a schematic circuit diagram of a dual-voltage POR circuit 700 configured in accordance with another example embodiment of the invention. In practice, the methodology represented by the POR circuit 700 can be extended to contemplate any number of supply voltages. The POR circuit 700 includes a suitably configured control circuit that minimizes, reduces or prevents steady state current consumption by the POR circuit 700. Some of the features and elements of the POR circuit 700 are identical or equivalent to features and elements described above in connection with the other POR circuits. For the sake of brevity, such common features, elements, and characteristics are not described again. Briefly, the POR circuit 700 includes a first PMOS transistor 702, a second PMOS transistor 704, a first NMOS transistor 706, a second NMOS transistor 708, a first inverter 710, and a second inverter 712. The POR circuit 700 also includes a control circuit coupled to the PMOS transistors; in this example embodiment, the control circuit includes a third NMOS transistor 714, a fourth NMOS transistor 716, a first coupling capacitor 718, a second coupling capacitor 720, a third inverter 722, and a fourth inverter 724.

As shown in FIG. 7, NMOS transistor 714 has a grounded source, a gate that receives the VDD1 supply voltage signal, and a drain coupled to a node 726. Coupling capacitor 718 has one end coupled to node 726 and the other end that receives the VDD2 supply voltage signal. Inverter 722 has an input coupled to node 726 and an output coupled to the gate of PMOS transistor 702. In this example, inverter 722 is also coupled to VDD2, which serves as a supply voltage for inverter 722. NMOS transistor 716, coupling capacitor 720, and inverter 724 are arranged in a symmetrical manner as depicted in FIG. 7.

In operation, the control circuit utilized by the POR circuit 700 eliminates the steady state current draw that would otherwise remain in, for example, the POR circuit 600. Assuming that VDD2 ramps up before VDD1, NMOS transistor 716 will turn on, the input to inverter 724 will be pulled low, the gate of PMOS transistor 704 will be high, and, therefore, PMOS transistor 704 will turn off. Concurrently, NMOS transistor 714 will turn off, causing coupling capacitor 718 to charge such that the voltage at the input of inverter 722 follows VDD2. In response to this condition, the input to inverter 722 will be high, the gate of PMOS transistor 702 will be low, and, therefore, PMOS transistor 702 will turn on. Activation of PMOS transistor 702 will cause the voltage at the POR node 728 to go high (as previously described). The POR circuit 700 produces a similar result if VDD1 ramps up before VDD2.

When both VDD1 and VDD2 ramp up, NMOS transistor 706 and NMOS transistor 708 turn on, thus pulling the voltage at POR node 728 to a low level, which in turn de-asserts the circuit module reset signals as discussed above. Moreover, the ramping up of VDD1 turns NMOS transistor 714 on, and the ramping up of VDD2 turns NMOS transistor 716 on, which results in a low level condition at the input of inverter 722 and at the input of inverter 724. Consequently, the outputs of inverters 722 and 724 go high, which turns off PMOS transistors 702 and 704. Thus, at this steady state condition there is no current leakage path from the power supplies to ground.

Although the POR circuit 700 reduces or minimizes steady state current consumption, a dynamic current path remains when only one supply voltage is on. This current path runs between the active voltage supply and the inactive voltage supply (which is at ground potential during this period), via PMOS transistor 702 and PMOS transistor 704. The dashed arrow in FIG. 7 depicts this dynamic current path for the condition where VDD1 is ramped up and VDD2 is absent (at ground level). Although such dynamic current consumption may be tolerable in some applications, it may be undesirable in low power applications.

Figure 8:
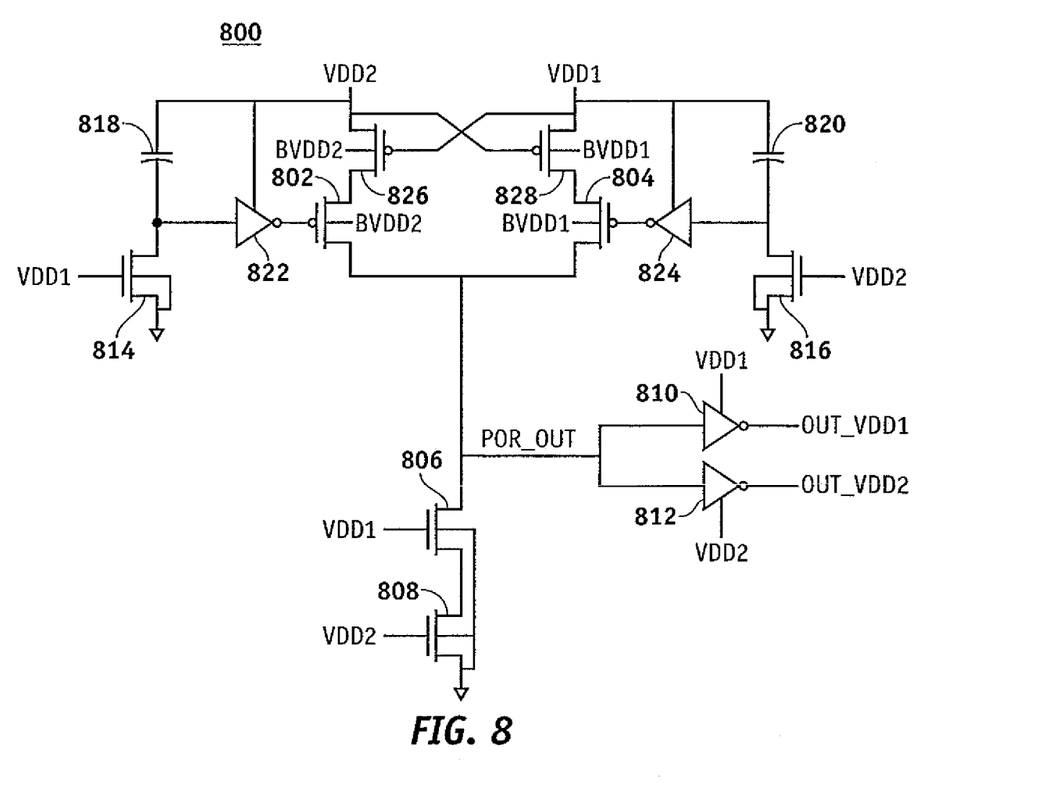
FIG. 8 is a schematic circuit diagram of a dual-voltage POR circuit in accordance with yet another example embodiment of the invention.

FIG. 8 is a schematic circuit diagram of a dual-voltage POR circuit 800 configured in accordance with yet another example embodiment of the invention. In practice, the methodology represented by the POR circuit 800 can be extended to contemplate any number of supply voltages. The POR circuit 800 also includes a suitably configured control circuit that reduces, minimizes or prevents steady state and dynamic current consumption by the POR circuit 800. Some of the features and elements of the POR circuit 800 are identical or equivalent to features and elements described above in connection with the other POR circuits. For the sake of brevity, such common features, elements, and characteristics will not be redundantly described herein. Briefly, the POR circuit 800 includes a first PMOS transistor 802, a second PMOS transistor 804, a first NMOS transistor 806, a second NMOS transistor 808, a first inverter 810, and a second inverter 812. The POR circuit 800 also includes a control circuit coupled to the PMOS transistors; in this example embodiment, the control circuit includes a third NMOS transistor 814, a fourth NMOS transistor 816, a first coupling capacitor 818, a second coupling capacitor 820, a third inverter 822, a fourth inverter 824, a third PMOS transistor 826, and a fourth PMOS transistor 828. FIG. 8 depicts the body (i.e., substrate) connections for the various PMOS and NMOS transistors.

Much of the topology of the POR circuit 800 is identical to that of the POR circuit 700. The POR circuit 800, however, includes PMOS transistors 826 and 828, which are cross-connected. PMOS transistor 826 has a drain coupled to the source of PMOS transistor 802, a source coupled to VDD2, and a gate coupled to VDD1. In addition, PMOS transistor 826 has a body coupled to receive a body voltage signal (identified as BVDD2 in FIG. 8). PMOS transistor 828 has a drain coupled to the source of PMOS transistor 804, a source coupled to VDD1, and a gate coupled to VDD2. In addition, PMOS transistor 828 has a body coupled to receive another body voltage signal (identified as BVDD1 in FIG. 8). In further contrast to the topology of the POR circuit 700, PMOS transistor 802 has a body coupled to receive BVDD2, while PMOS transistor 804 has a body coupled to receive BVDD1.

Figure 9:
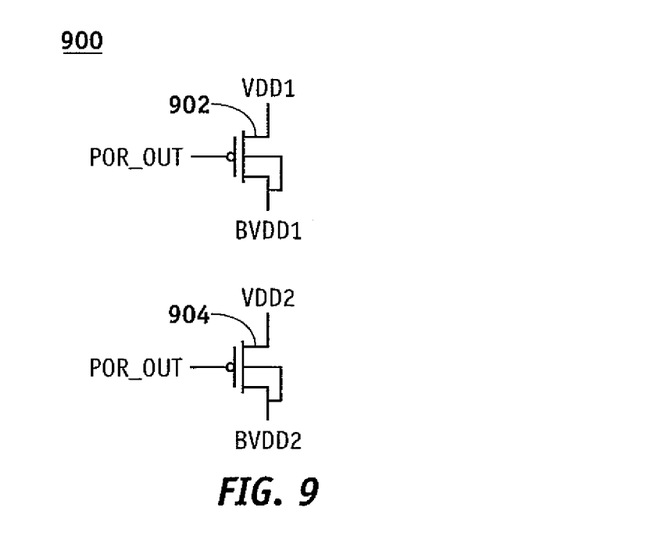
FIG. 9 is a schematic circuit diagram of an adaptive body bias circuit suitable for use in the POR circuit shown in FIG. 8.

The BVDD1 and BVDD2 voltages may be generated by a suitable adaptive body bias circuit. In this regard, FIG. 9 is a schematic circuit diagram of an adaptive body bias circuit 900 suitable for use in the POR circuit 800. The adaptive body bias circuit 900 includes PMOS transistors 902 and 904. PMOS transistor 902 has a source coupled to VDD1, a gate for receiving the POR_OUT signal (see FIG. 8), and a drain for providing BVDD1 to POR circuit 800. Similarly, PMOS transistor 904 has a source coupled to VDD2, a gate for receiving the POR_OUT signal, and a drain for providing BVDD2 to POR circuit 800.

In operation, the control circuit used by the POR circuit 800 eliminates the dynamic current draw that would otherwise remain in, for example, the POR circuit 700. The PMOS transistor 826 and PMOS transistor 828 cut off the direct path between the two voltage supplies during ramp up. Thus, even though the PMOS transistors 826 and 828 turn off in response to the ramp up of VDD1 and VDD2, respectively, their body diodes conduct and again form a leakage path. To address this current leakage, the bodies are initially kept floating so that they reach the output voltage level. The bodies are dynamically switched from the output when either of the voltage supplies are not present to the respective voltage supply once the supply is fully ramped up. This dynamic switching is performed by the adaptive body bias circuit 900.

In practice, the POR circuits described above are easy to design and use, and they reduce the risk that would otherwise be associated with voltage supply level differences or changes in voltage supply ramp up sequence. Reset synchronization between multi-voltage domains need not be used in connection with these POR circuits. In addition, an optimum power up sequence can be easily determined after fabrication of the multi-voltage circuit chip as the chip can be tested for different supply ramp up sequences using the POR circuit without any risk. A POR circuit as described above occupies less physical space than a counterpart circuit that uses multiple POR circuits.

In summary, systems, devices, and methods configured in accordance with example embodiments of the invention relate to:

A POR method for a multi-voltage circuit, the method including monitoring a plurality of sequence-independent supply voltages; asserting a POR signal for the multi-voltage circuit in response to ramp-up of a first sequence-independent supply voltage, wherein ramp-up of the first sequence-independent supply voltage occurs first in time; and de-asserting the POR signal in response to ramp-up of a last sequence-independent supply voltage, wherein ramp-up of the last sequence-independent supply voltage occurs last in time. The method may further comprise maintaining the POR signal while less than all of the plurality of sequence-independent supply voltages have ramped up. The method may further comprise preventing steady state current consumption associated with asserting the POR signal. The method may further comprise preventing dynamic current consumption associated with asserting the POR signal. The method may further comprise preventing steady state and dynamic current consumption associated with asserting the POR signal.

A POR circuit for a multi-voltage circuit, the POR circuit including a POR node for a POR output signal; a pull-up circuit comprising a pull-up output node coupled to the POR node, and having pull-up input nodes for receiving a plurality of supply voltage signals; and a pull-down circuit comprising a pull-down output node coupled to the POR node, and having pull-down input nodes for receiving the plurality of supply voltage signals; the pull-up circuit and the pull-down circuit generate a high POR output signal at the POR node in response to ramp-up of a first supply voltage signal, wherein ramp-up of the first supply voltage signal occurs first in time, and generate a low POR output signal at the POR node in response to ramp-up of a last supply voltage signal, wherein ramp-up of the last supply voltage signal occurs last in time. The plurality of supply voltage signals may be sequence-independent signals. The POR circuit may further comprise a POR signal generator having an input node coupled to the POR node, the POR signal generator generating at least one module reset signal for the multi-voltage circuit. The POR signal generator may have N output nodes for N module reset signals corresponding to N supply voltages. The POR circuit may further comprise a control circuit coupled to the pull-up circuit, the control circuit influencing operation of the pull-up circuit to minimize steady state current consumption associated with generation of the high POR output signal and the low POR output signal. The POR circuit may further comprise a control circuit coupled to the pull-up circuit, the control circuit influencing operation of the pull-up circuit to minimize dynamic current consumption associated with generation of the high POR output signal and the low POR output signal. The POR circuit may further comprise a control circuit coupled to the pull-up circuit, the control circuit influencing operation of the pull-up circuit to minimize steady state and dynamic current consumption associated with generation of the high POR output signal and the low POR output signal. The pull-up circuit may comprise a plurality of PMOS transistors, each having a drain coupled to the POR node, and each having a source coupled to one of the pull-up input nodes. The pull-down circuit may comprise a plurality of NMOS transistors coupled in series between the POR node and a low reference potential, each of the NMOS transistors having a gate coupled to one of the pull-down input nodes.

A POR circuit for a multi-voltage circuit having N supply voltages, the POR circuit including a POR node for a POR output signal; N PMOS transistors, each having a drain coupled to the POR node, and each having a source for receiving a different one of N supply voltage signals; and N NMOS transistors coupled in series between the POR node and a low reference potential, each of the NMOS transistors having a gate for receiving a different one of the N supply voltage signals; the PMOS transistors and the NMOS transistors generating a high POR output signal at the POR node if at least one, but not all, of the supply voltage signals has ramped up, and generating a low POR output signal if all of the supply voltage signals have ramped up. The supply voltage signals may be sequence-independent signals. The POR circuit may further comprise a control circuit coupled to the PMOS transistors that influences operation of the PMOS transistors to reduce steady state current consumption associated with generation of the high POR output signal and the low POR output signal. The POR circuit may further comprise a control circuit coupled to the PMOS transistors that influences operation of the PMOS transistors to reduce dynamic current consumption associated with generation of the high POR output signal and the low POR output signal. In one embodiment, N=2; the supply voltage signals include a first supply voltage signal and a second supply voltage signal; the PMOS transistors include a first PMOS transistor having a gate for receiving a first switching signal based upon the first supply voltage signal, and having a source for receiving the second supply voltage signal; and the PMOS transistors include a second PMOS transistor having a gate for receiving a second switching signal based upon the second supply voltage signal, and having a source for receiving the first supply voltage signal.

While at least one example embodiment has been presented in the foregoing detailed description, it should be appreciated that a vast number of variations exist. It should also be appreciated that the example embodiment or embodiments described herein are not intended to limit the scope, applicability, or configuration of the invention in any way. Rather, the foregoing detailed description will provide those skilled in the art with a convenient road map for implementing the described embodiment or embodiments. It should be understood that various changes can be made in the function and arrangement of elements without departing from the scope of the invention as set forth in the appended claims and the legal equivalents thereof.

The invention claimed is:

1. A power-on reset ("POR") circuit for a multi-voltage circuit, said POR circuit comprising:
   a POR node for a POR output signal;
   a pull-up circuit comprising a pull-up output node coupled to said POR node, and having pull-up input nodes for receiving a plurality of supply voltage signals, wherein said pull-up circuit comprises a plurality of PMOS transistors, each having a drain coupled to said POR node, and each having a source coupled to one of said pull-up input nodes; and
   a pull-down circuit comprising a pull-down output node coupled to said POR node, and having pull-down input nodes for receiving said plurality of supply voltage signals, wherein said pull down circuit comprises a plurality of NMOS transistors coupled in series between said POR node and a low reference potential, each of said NMOS transistors having a gate coupled to one of said pull-down input nodes;
   wherein said pull-up circuit and said pull-down circuit generate a high POR output signal at said POR node in response to ramp-up of a first supply voltage signal, wherein ramp-up of said first supply voltage signal occurs first in time, and wherein said pull-up circuit and said pull-down circuit generate a low POR output signal at said POR node in response to ramp-up of a last supply voltage signal, wherein ramp-up of said last supply voltage signal occurs last in time.

2. The POR circuit of claim 1, wherein said plurality of supply voltage signals are sequence-independent signals.

3. The POR circuit of claim 1, further comprising a POR signal generator having an input node coupled to said POR node, said POR signal generator generating at least one module reset signal for the multi-voltage circuit.

4. The POR circuit of claim 3, wherein said POR signal generator has N output nodes for N module reset signals corresponding to N supply voltages.

5. The POR circuit of claim 1, further comprising a control circuit coupled to said pull-up circuit, said control circuit influencing operation of said pull-up circuit to reduce steady state current consumption associated with generation of said high POR output signal and said low POR output signal.

6. The POR circuit of claim 1, further comprising a control circuit coupled to said pull-up circuit, said control circuit influencing operation of said pull-up circuit to reduce dynamic current consumption associated with generation of said high POR output signal and said low POR output signal.

7. The POR circuit of claim 1, further comprising a control circuit coupled to said pull-up circuit, said control circuit influencing operation of said pull-up circuit to reduce steady state and dynamic current consumption associated with generation of said high POR output signal and said low POR output signal.

8. A power-on reset ("POR") circuit for a multi-voltage circuit having N supply voltages, said POR circuit comprising:
   a POR node for a POR output signal;
   N PMOS transistors, each having a drain coupled to said POR node, and each having a source for receiving a different one of N supply voltage signals;
   N NMOS transistors coupled in series between said POR node and a low reference potential, each of said NMOS transistors having a gate for receiving a different one of said N supply voltage signals;
   said PMOS transistors and said NMOS transistors generating a high POR output signal at said POR node if at least one, but not all, of said supply voltage signals has ramped up, and generating a low POR output signal if all of said supply voltage signals have ramped up; and
   a control circuit coupled to said PMOS transistors, said control circuit influencing operation of said PMOS transistors to reduce steady state and dynamic current consumption associated with generation of said high POR output signal and said low POR output signal.

9. The POR circuit of claim 8, wherein said supply voltage signals are sequence-independent signals.

* * * * *